US007627028B1

United States Patent
Frei et al.

(10) Patent No.: US 7,627,028 B1
(45) Date of Patent: Dec. 1, 2009

(54) MULTI-PORT S-PARAMETER AND T-PARAMETER CONVERSION

(75) Inventors: James M. Frei, Sunol, CA (US); Xiao-Ding Cai, Fremont, CA (US); Stephen A. Muller, Santa Clara, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 12/253,944

(22) Filed: Oct. 18, 2008

(51) Int. Cl.
H04B 3/46 (2006.01)
(52) U.S. Cl. ...................................... 375/224
(58) Field of Classification Search ......... 375/224–228, 375/257; 324/638, 76.19, 76.21, 601; 702/66, 702/117, 118
See application file for complete search history.

(56) References Cited

U.S. PATENT DOCUMENTS 6,665,628 B2  12/2003  Martens
2002/0053899 A1*  5/2002  Adamian et al. .......... 324/76.19
2003/0208327 A1*  11/2003  Martens ........................ 702/65
2004/0193382 A1*  9/2004  Adamian et al. ............ 702/118

* cited by examiner

Primary Examiner—Don N Vo
(74) Attorney, Agent, or Firm—Brooks Kushman P.C.

(57) ABSTRACT

A method for making measurements using a vector network analyzer, and for multi-port S-parameter and T-parameter conversion includes a generalized T-matrix definition that facilitates the conversion between the S-parameters and the T-parameters for multi-port networks based on the well understood and mathematically simple 2-port relations. One contemplated approach generalizes all multi-port networks into two cases: balanced and unbalanced. Through careful selection of the T-matrix, the contemplated method extends 2-port symmetry to multi-port networks and provides an engineering implementable relationship between the S- and T-parameters for multi-port networks. This symmetry extension allows a practical means to cascade and de-embed such networks.

20 Claims, 9 Drawing Sheets

$$\begin{bmatrix} b_1 \\ b_2 \\ b_3 \end{bmatrix} = \begin{bmatrix} S_{11} & S_{12} & S_{13} \\ S_{21} & S_{22} & S_{23} \\ S_{31} & S_{32} & S_{33} \end{bmatrix} \cdot \begin{bmatrix} a_1 \\ a_2 \\ a_3 \end{bmatrix}$$

$$\begin{bmatrix} b_1 \\ b_2 \\ a_1 \\ a_2 \end{bmatrix} = \begin{bmatrix} T_{11} & T_{12} \\ T_{21} & T_{22} \\ T_{31} & T_{32} \\ T_{41} & T_{42} \end{bmatrix} \cdot \begin{bmatrix} a_3 \\ b_3 \end{bmatrix}$$

$$\begin{bmatrix} b_1 \\ b_2 \\ b_3 \end{bmatrix} = \begin{bmatrix} S_{11} & S_{12} & S_{13} \\ S_{21} & S_{22} & S_{23} \\ S_{31} & S_{32} & S_{33} \end{bmatrix} \cdot \begin{bmatrix} a_1 \\ a_2 \\ a_3 \end{bmatrix}$$

$$\begin{bmatrix} b_1 \\ a_1 \end{bmatrix} = \begin{bmatrix} T_{11} & T_{12} & T_{13} & T_{14} \\ T_{21} & T_{22} & T_{23} & T_{24} \end{bmatrix} \cdot \begin{bmatrix} a_2 \\ a_3 \\ b_2 \\ b_3 \end{bmatrix}$$

FIG. 1

$$\begin{bmatrix} \overbrace{\begin{bmatrix}T_{11}\end{bmatrix}}^{T_{[I,I]}} & \overbrace{\begin{bmatrix}T_{12}\end{bmatrix}}^{T_{[I,II]}} \\ \begin{bmatrix}T_{21}\end{bmatrix} & \begin{bmatrix}T_{22}\end{bmatrix} \\ \underbrace{\phantom{[T_{21}]}}_{T_{[II,I]}} & \underbrace{\phantom{[T_{22}]}}_{T_{[II,II]}} \end{bmatrix} \Rightarrow \begin{bmatrix} [T_{I,I}] & [T_{I,II}] \\ [T_{II,I}] & [T_{II,II}] \end{bmatrix}$$

$$\begin{bmatrix} \overbrace{\begin{bmatrix}T_{11} & T_{12} \\ T_{21} & T_{22}\end{bmatrix}}^{T_{[I,I]}} & \overbrace{\begin{bmatrix}T_{13} & T_{14} \\ T_{23} & T_{24}\end{bmatrix}}^{T_{[I,II]}} \\ \begin{bmatrix}T_{31} & T_{32} \\ T_{41} & T_{42}\end{bmatrix} & \begin{bmatrix}T_{33} & T_{34} \\ T_{43} & T_{44}\end{bmatrix} \\ \underbrace{\phantom{XXXXX}}_{T_{[II,I]}} & \underbrace{\phantom{XXXXX}}_{T_{[II,II]}} \end{bmatrix} \Rightarrow \begin{bmatrix} [T_{I,I}] & [T_{I,II}] \\ [T_{II,I}] & [T_{II,II}] \end{bmatrix}$$

$$\begin{bmatrix} \overbrace{\begin{bmatrix}T_{11} & T_{12} & T_{13} \\ T_{21} & T_{22} & T_{23} \\ T_{31} & T_{32} & T_{33}\end{bmatrix}}^{T_{[I,I]}} & \overbrace{\begin{bmatrix}T_{14} & T_{15} & T_{16} \\ T_{24} & T_{25} & T_{26} \\ T_{34} & T_{35} & T_{36}\end{bmatrix}}^{T_{[I,II]}} \\ \begin{bmatrix}T_{41} & T_{42} & T_{43} \\ T_{51} & T_{52} & T_{53} \\ T_{61} & T_{62} & T_{63}\end{bmatrix} & \begin{bmatrix}T_{44} & T_{45} & T_{46} \\ T_{54} & T_{55} & T_{56} \\ T_{64} & T_{65} & T_{66}\end{bmatrix} \\ \underbrace{\phantom{XXXXXXX}}_{T_{[II,I]}} & \underbrace{\phantom{XXXXXXX}}_{T_{[II,II]}} \end{bmatrix} \Rightarrow \begin{bmatrix} [T_{I,I}] & [T_{I,II}] \\ [T_{II,I}] & [T_{II,II}] \end{bmatrix}$$

FIG. 2

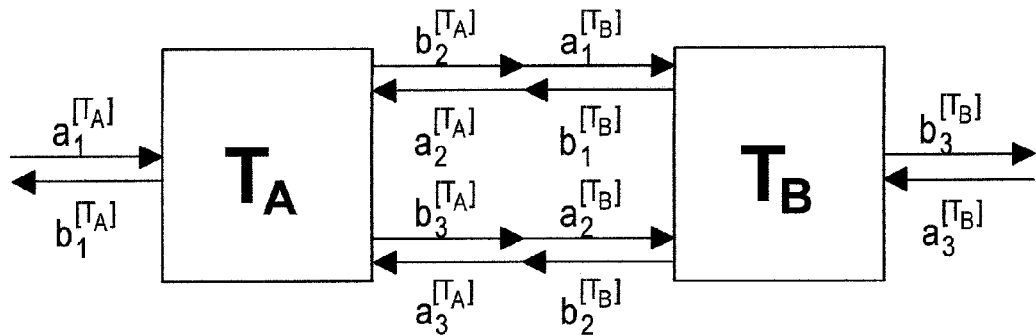
FIG. 3
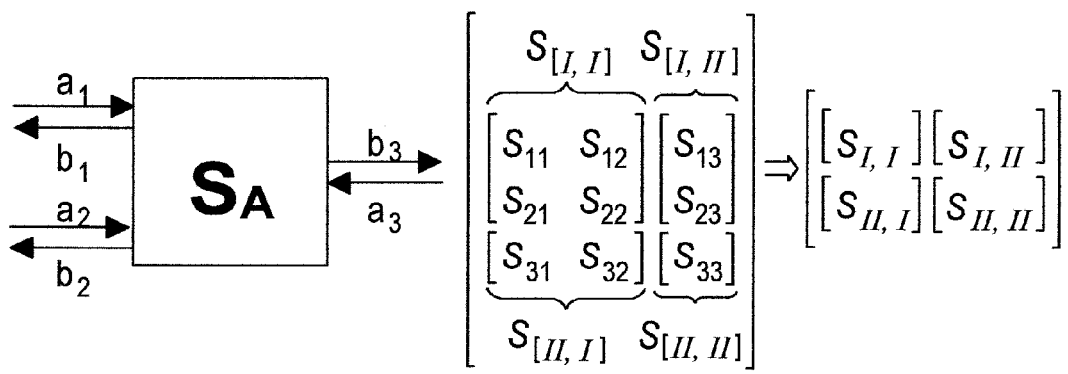
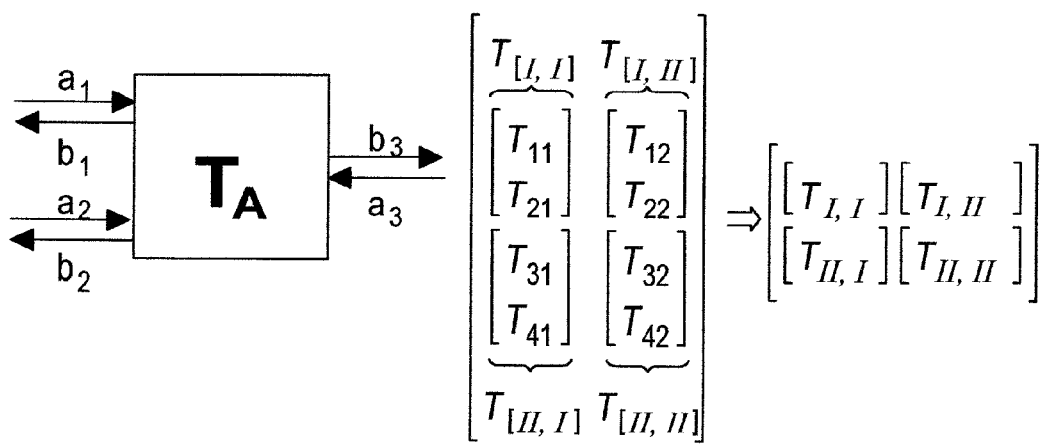
FIG. 4

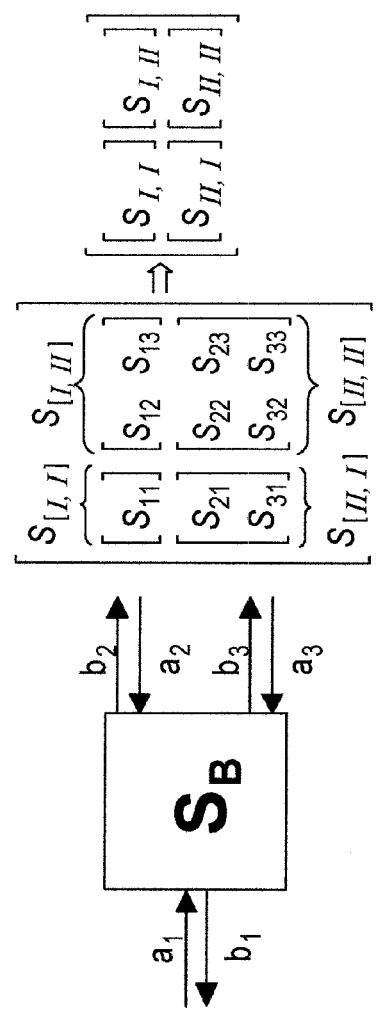
FIG. 5
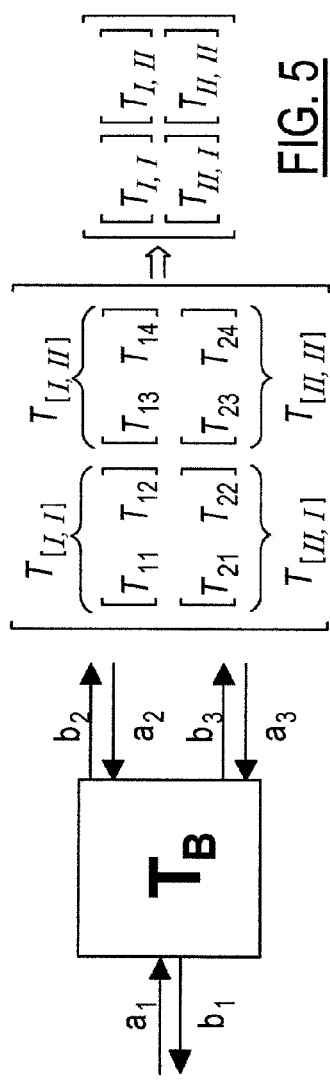
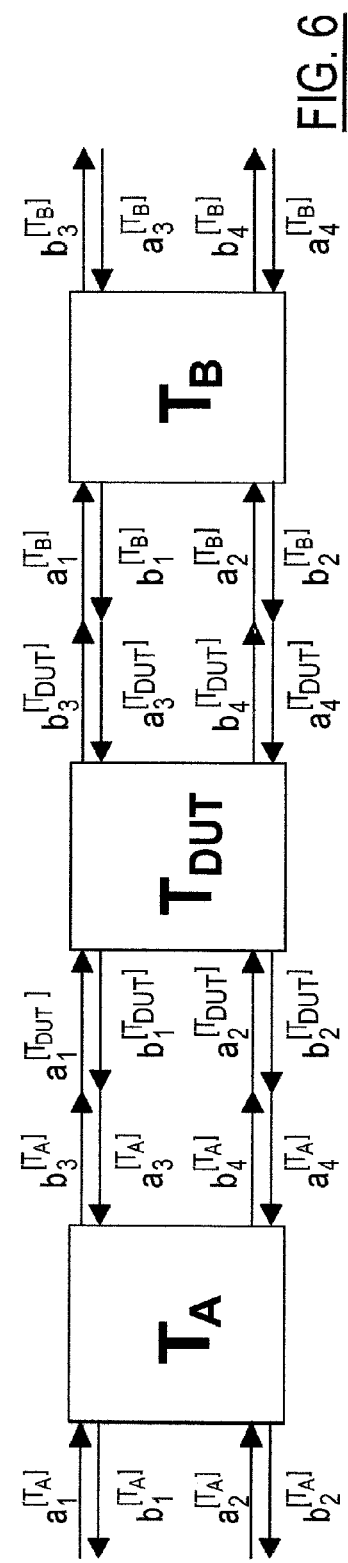
FIG. 6

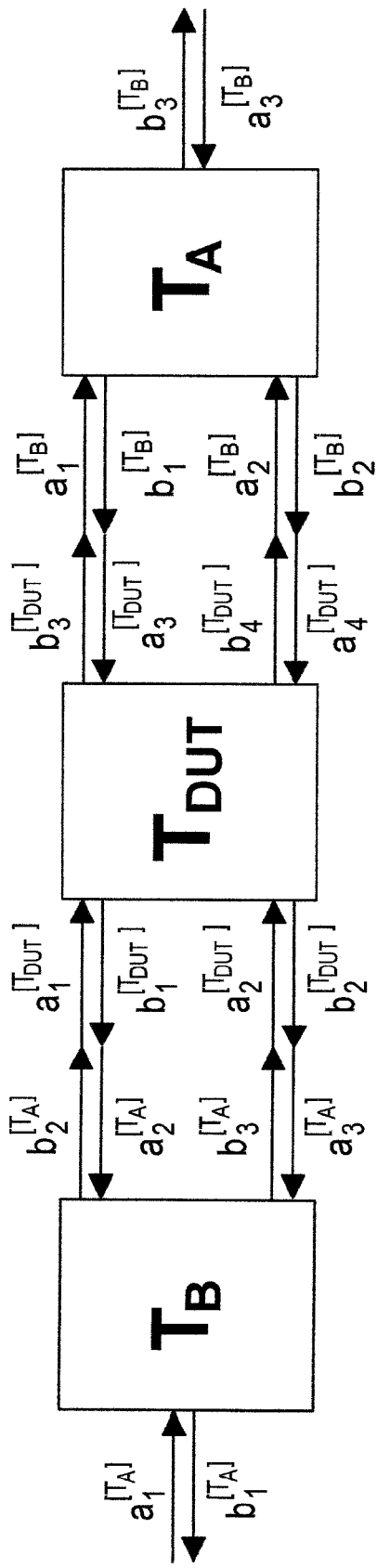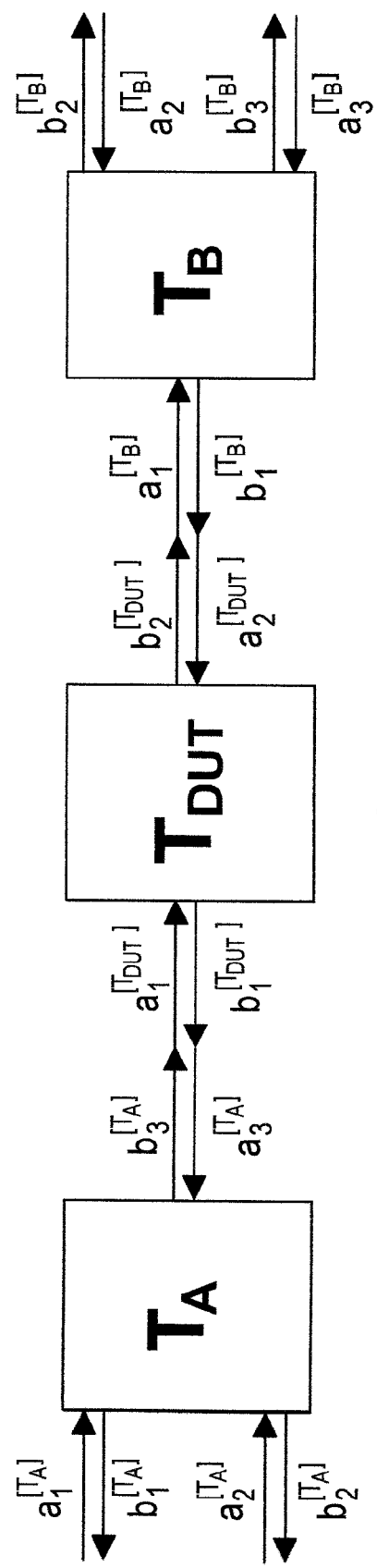

MULTI-PORT S-PARAMETER AND T-PARAMETER CONVERSION

BACKGROUND OF THE INVENTION

1. Field of the Invention

The invention relates to virtually embedding and de-embedding networks when making measurements using a vector network analyzer (VNA), and to multi-port S-parameter and T-parameter conversion.

2. Background Art

A. Background

As high speed interconnects become an important element for high speed digital systems, analyzing them with the Scattering (S-) parameter has been a crucial step. In many applications, a device under test (DUT) is embedded into the test setup and cannot be measured directly. In order to extract the S-parameter for the DUT from embedded systems, a procedure called de-embedding is used. Literature points to a few ways of performing de-embedding[1, 2, 3], one of which is to use the transmission matrix, or T-matrixF[2, 3].

Historically, the T-matrix has been applied primarily to 2-port networks where de-embedding is straightforward. However, many high speed interconnects use 4-port networks or even 3-port networks as a basic point-to-point interconnecting element which can be grouped to form more complex multi-port systems. In general, de-embedding of such grouped multi-port networks requires a further development of the T-matrix and its conversion to the S-parameter.

B. The S-Matrix

The S-matrix is a way to express the scattering parameter or S-parameter in a matrix form. This form mathematically relates the normalized incident waves, a, to the normalized reflected waves b. A typical nomenclature for the S-matrix equations of multi-port networks is as follows:

$$\begin{bmatrix} b_1 \\ b_2 \\ \vdots \\ b_N \end{bmatrix} = \begin{bmatrix} S_{11} & S_{12} & \ldots & S_{1N} \\ S_{12} & S_{22} & \ldots & S_{2N} \\ \vdots & \vdots & \ddots & \vdots \\ S_{N1} & S_{N2} & \ldots & S_{NN} \end{bmatrix} \cdot \begin{bmatrix} a_1 \\ a_2 \\ \vdots \\ a_N \end{bmatrix} = [S] \cdot \begin{bmatrix} a_1 \\ a_2 \\ \vdots \\ a_N \end{bmatrix} \quad (1)$$

where S is the normalized scattering matrix. An alternate form of (1) is[4]:

$$b_i = \sum_j S_{ij} \cdot a_j. \quad (2)$$

From (1) it is observed that the scattering coefficients are found by setting all inputs except $a_j$ to zero by terminating the ports to perfectly matched loads. For an N-port system, the scattering coefficients are[4, 5]:

$$S_{ij} = \frac{b_i}{a_j} \bigg|_{a_k = 0, k \neq j}. \quad (3)$$

These coefficients are useful in the fact that each has a direct physical significance, which is most apparent in the diagonal of the S-matrix with each element being the reflection coefficient for a pertinent port.

The main drawback of the S-matrix is that it is limited to not having a direct cascading relationship. Instead, for these systems another representation known as the scattering transmission matrix or T-matrix is used, therefore the effect of cascading two or more multi-port networks is found by simply multiplying sequentially the associated T-matrices.

C. T-Matrix

Even though the T-matrix is mathematically simpler for cascaded ports, there are two difficulties when using the T-matrix. The first is that there is no standardized setup for defining the T-matrix. This is manifested in literatures for 2-port networks where the most common definition of the T-matrix is[6, 7]:

$$\begin{bmatrix} b_1 \\ a_1 \end{bmatrix} = \begin{bmatrix} T_{11} & T_{12} \\ T_{21} & T_{22} \end{bmatrix} \cdot \begin{bmatrix} a_2 \\ b_2 \end{bmatrix} \quad (4)$$

and another definition defines the same network as[4, 8]:

$$\begin{bmatrix} a_1 \\ b_1 \end{bmatrix} = \begin{bmatrix} T_{11} & T_{12} \\ T_{21} & T_{22} \end{bmatrix} \cdot \begin{bmatrix} b_2 \\ a_2 \end{bmatrix}. \quad (5)$$

Despite the fact that both definitions may be mathematically valid, this confusion in setup has led to a poor understanding and interpretation of the transmission (T-) parameter. For example, the 4-port T-matrix could be defined as[9]:

$$\begin{bmatrix} a_1 \\ a_2 \\ b_1 \\ b_2 \end{bmatrix} = \begin{bmatrix} T_{11} & T_{12} & T_{13} & T_{14} \\ T_{21} & T_{22} & T_{23} & T_{24} \\ T_{31} & T_{32} & T_{33} & T_{34} \\ T_{41} & T_{42} & T_{43} & T_{44} \end{bmatrix} \cdot \begin{bmatrix} b_3 \\ b_4 \\ a_3 \\ a_4 \end{bmatrix} \quad (6)$$

or[10]

$$\begin{bmatrix} b_1 \\ a_1 \\ b_2 \\ a_2 \end{bmatrix} = \begin{bmatrix} T_{11} & T_{12} & T_{13} & T_{14} \\ T_{21} & T_{22} & T_{23} & T_{24} \\ T_{31} & T_{32} & T_{33} & T_{34} \\ T_{41} & T_{42} & T_{43} & T_{44} \end{bmatrix} \cdot \begin{bmatrix} a_3 \\ b_3 \\ a_4 \\ b_4 \end{bmatrix}. \quad (7)$$

However, since the definitions of these matrices are different, it is obvious that the coefficients are different. This means that the interpretation of each mathematically valid T-matrix is specific to the setup definition. Additionally, since the number of parameters increases with port size, non-standardized definitions augment confusion with larger port networks.

The second difficulty with using the T-matrix is that the symmetry that exists in balanced-port networks breaks down for unbalanced-ports. Balanced networks are symmetric to the 2-port network as they have the same number of entrance and exit ports. Conversely, unbalanced networks do not have the same number of entrance and exit ports, which generates a non-square T-matrix. This imbalance is evident when comparing the S-matrix and the T-matrix for 3-port networks illustrated in FIG. 1. In this example, the S-matrix has more elements and remains a square 3×3 matrix regardless of the port ordering; whereas the T-matrix becomes non-square with the size dependent on the number of entrance ports, m, and exit ports, n, (m≠n).

D. References

[1] Hao Shi, W. T. Beyene, J. Feng, B. Chia, X. Yuan, *Properties of Mixed-Mode Parameters of Cascaded Balanced Networks and Their Applications in Modeling of Differential Interconnects*, IEEE Transactions on Microwave Theory and Techniques, Vol. 54, No. 1, pp. 360-372, 2006.

[2] G. Antonini, A. C. Scogna, A. Orlandi, *S-Parameters Characterization of Through, Blind, and Buried Via Holes*, IEEE Transactions on Mobile Computing, pp. 174-183, 2003.

[3] H. Barnes, A. Ciccomancini, M. Resso, M. Tsai, *Differential PCB Structures Using Measured TRL Calibration and Simulated Structure De-Embedding*, DesignCon 2007.

[4] L. A. Coldren, S. W. Corzine, *Diode Lasers and Photonic Integrated Circuits*, John Wiley & Sons, Inc., 1995.

[5] D. Pozar, *Microwave Engineering*, Wiley, 1997.

[6] H. J. Carlin, A. B. Giordano, *Network Theory: An Introduction to Reciprocal and Nonreciprocal Circuits*, PrenticeHall, Inc., 1964.

[7] S. Ramo, J. R. Whinnery, T. Van Duzer, *Fields and Waves in Communication*, John Wiley and Sons, 1965.

[8] R. Mavaddat, *Network Scattering Parameters*, World Scientific, Singapore, 1996.

[9] L. G. Maloratsky, *Passive RF & Microwave Circuits*, 2003.

[10] J. A. Dobrowolski, *Introduction to Computer Methods for Microwave Circuit Analysis and Design*, Artech House, 1991.

[11] C. Seguinot, P. Kennis, J. Legier, F. Huret, E. Paleczny, and L. Hayden, *Multimode TRL—A New Concept in Microwave Measurements: Theory and Experimental Verification*, IEEE Transactions on Microwave Theory and Techniques, Vol. 46, No. 5, pp. 536-542, May 1998.

[12] G. Golub, W. Kahan, *Calculating the Singular Values and Pseudo-Inverse of a Matrix*, Journal of the Society for Industrial and Applied Mathematics: Series B, Numerical Analysis, Vol. 2, No. 2, pp. 205-224, 1965.

[13] Shouyuan Lin, *General Transmission Matrix*, Acta Electronica Sinica, pp. 73-78, 1983.

Further background information may be found in U.S. Pat. No. 6,665,628.

SUMMARY OF THE INVENTION

It is an object of the invention to provide an improved multi-port S-parameter and T-parameter conversion method.

According to the invention, a method for making measurements using a vector network analyzer, and for multi-port S-parameter and T-parameter conversion is provided. The method comprises defining an S-matrix according to:

$$\begin{bmatrix} b_1 \\ b_2 \\ \vdots \\ b_N \end{bmatrix} = \begin{bmatrix} S_{11} & S_{12} & \cdots & S_{1N} \\ S_{21} & S_{22} & \cdots & S_{2N} \\ \vdots & \vdots & \ddots & \vdots \\ S_{N1} & S_{N2} & \cdots & S_{NN} \end{bmatrix} \cdot \begin{bmatrix} a_1 \\ a_2 \\ \vdots \\ a_N \end{bmatrix} = [S] \cdot \begin{bmatrix} a_1 \\ a_2 \\ \vdots \\ a_N \end{bmatrix}$$

wherein the size of the S-matrix is N×N such that N is the number of ports for a network being analyzed.

The method further comprises defining quadrants for the S-matrix by dividing the S-matrix into quadrants. Each quadrant is a sub-matrix. The divided S-matrix provides a grouping symmetry to a 2-port network.

The method further comprises defining a T-matrix according to:

$$\begin{bmatrix} b_1 \\ b_2 \\ \vdots \\ b_m \\ a_1 \\ a_2 \\ \vdots \\ a_m \end{bmatrix} = \begin{bmatrix} T_{11} & T_{12} & \cdots & T_{1N} \\ T_{21} & T_{22} & \cdots & T_{2N} \\ \vdots & \vdots & \ddots & \vdots \\ T_{M1} & T_{M2} & \cdots & T_{MN} \end{bmatrix} \cdot \begin{bmatrix} a_{(m+1)} \\ a_{(m+2)} \\ \vdots \\ a_{m+n} \\ b_{(m+1)} \\ b_{(m+2)} \\ \vdots \\ b_{m+n} \end{bmatrix}$$

wherein the size of the T-matrix is M×N such that M=2×m and N=2×n where m is the number of entrance ports and n is the number of exit ports for the network being analyzed.

The method further comprises defining quadrants for the T-matrix by dividing the T-matrix into quadrants. Each quadrant is a sub-matrix. The divided T-matrix provides the same grouping symmetry to the 2-port network to provide a defined relationship between the S- and T-matrices.

The method further comprises making measurements pertaining to a plurality of networks, and manipulating the measurements in accordance with the defined relationship between the S- and T-matrices to result in other measurements pertaining to the plurality of networks.

In more detail, the invention comprehends methods for cascading and de-embedding networks.

The method comprehends cascading a first network having an S-matrix $S_A$, a second network having an S-matrix $S_{DUT}$, and a third network having an S-matrix $S_B$. The cascading comprises converting the S-matrices $S_A$, $S_{DUT}$, and $S_B$ to corresponding T-matrices $T_A$, $T_{DUT}$, and $T_B$ in accordance with the defined relationship. The matrices $T_A$, $T_{DUT}$, and $T_B$ are sequentially multiplied to produce T-matrix $T_{Total}$.

The method further comprises converting the T-matrix $T_{Total}$ to a corresponding S-matrix $S_{Total}$ in accordance with the defined relationship.

The method also comprehends de-embedding an embedded network from a sequence of cascaded networks having an S-matrix $S_{Total}$. The sequence of cascaded networks includes a first network having an S-matrix $S_A$, the embedded network, and a third network having an S-matrix $S_B$. The de-embedding comprises converting the S-matrices $S_A$, $S_B$, and $S_{Total}$ to corresponding T-matrices $T_A$, $T_B$, and $T_{Total}$ in accordance with the defined relationship. The T-matrices $T_A$ and $T_B$ are inverted to produce respective inverted T-matrices $[T_A]^{-1}$ and $[T_B]^{-1}$.

The method further comprises sequentially multiplying matrices $[T_A]^{-1}$, $T_{Total}$, and $[T_B]^{-1}$ to produce T-matrix $T_{DUT}$. The T-matrix $T_{DUT}$ is converted to a corresponding S-matrix $S_{DUT}$ in accordance with the defined relationship.

Embodiments of the invention have many advantages. For example, the contemplated embedding and de-embedding techniques may be utilized for measuring interconnects such as traces and connectors. Although the typical vector network analyzer is used to measure S-parameters, and cannot measure T-parameters, the methods of the invention allow measurements to be manipulated in accordance with the defined relationship between the S- and T-matrices to result in other measurements.

Further, embodiments of the invention may be employed for any instrument that measures S-parameters to convert to T-parameters, for example, with the push of a button. For example, when measuring the S-parameters on a VNA, one could push a button and display the results in T-parameters. Also, another option that could be implemented is cascading and de-embedding such measurements for high speed applications, such as PCBs, interconnects, vias, etc. Embodiments of the invention are not limited to one specific device, such as the VNA, and another similar device that measures S-parameters could use the contemplated techniques and, for example, with the of a push button, display the T-parameters.

BRIEF DESCRIPTION OF THE DRAWINGS

FIG. 1 illustrates the S-matrix and the T-matrix for 3-port networks;

FIG. 2 illustrates quadrant equivalents for 2-, 4-, and 6-port networks;

FIG. 3 illustrates cascading unbalanced 3-port networks, wherein the total forms a balanced 2-port network;

FIG. 4 illustrates dividing the S- and T-matrices such that each sub-matrix quadrant corresponds to a 2-port equivalent for a 3-port network with two entrance ports and one exit port;

FIG. 5 illustrates dividing the S- and T-matrices such that each sub-matrix quadrant corresponds to a 2-port equivalent for a 3-port network with one entrance port and two exit ports;

FIG. 6 illustrates a system of cascaded balanced 4-port networks, $T_A$, $T_{DUT}$, and $T_B$;

FIG. 9 illustrates a system of cascaded balanced and unbalanced networks $T_B$, $T_{DUT}$, and $T_A$, wherein $T_{Total}$ and $T_{DUT}$ are balanced networks;

FIG. 10 illustrates a system of cascaded balanced and unbalanced networks $T_A$, $T_{DUT}$, and $T_B$, wherein $T_{Total}$ and $T_{DUT}$ are balanced networks;

DETAILED DESCRIPTION OF THE PREFERRED EMBODIMENT

I. Theory

Figure 7:
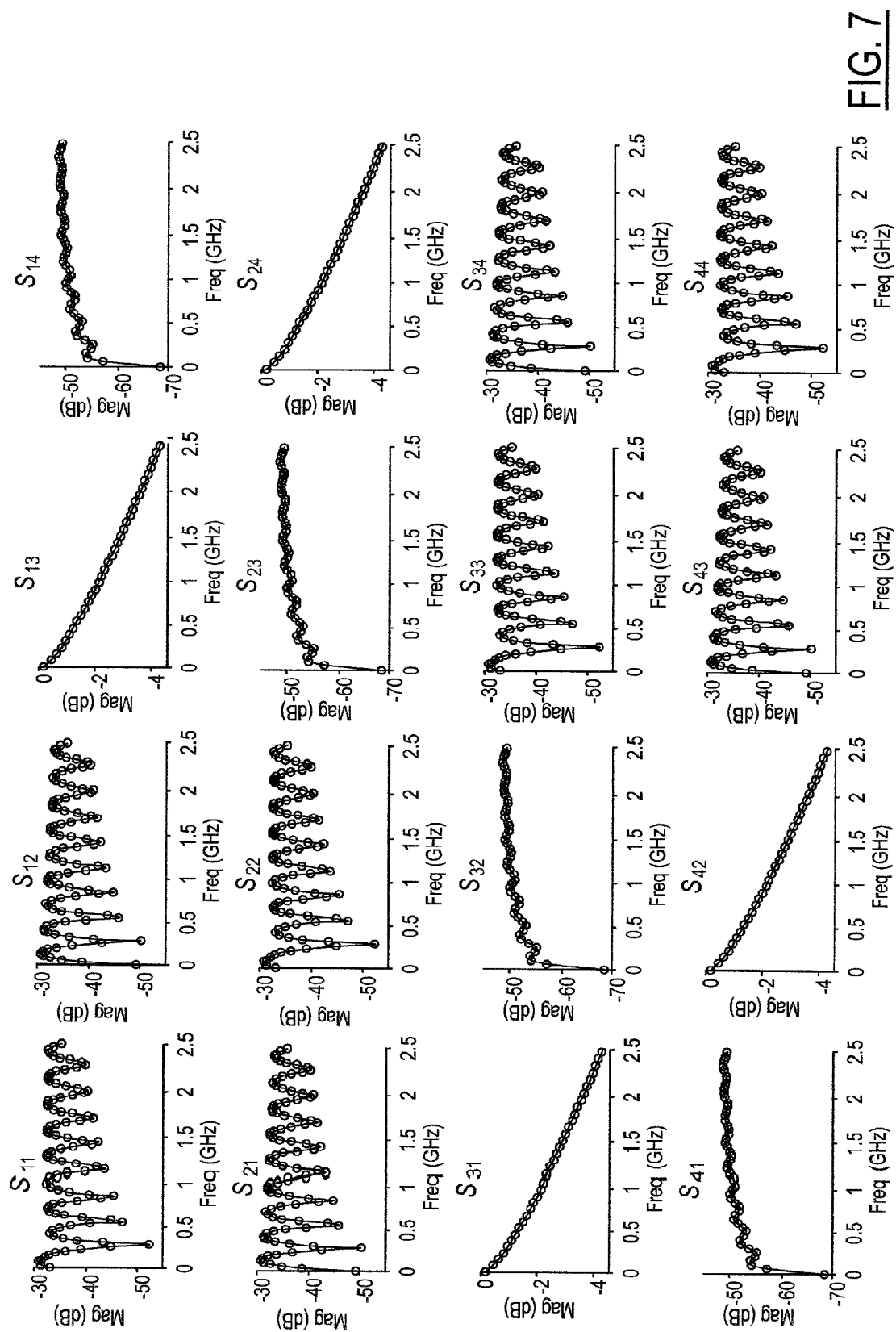
FIG. 7 illustrates magnitude values for each S-parameter where the lines represent original $S_{DUT}$ values and the circles are the de-embedded $S_{DUT}$ values, the Figure is limited to 2.5 GHz for illustration purposes and embodiments of the invention are not limited in frequency.

A. New T-matrix Definition for Multi-Port Networks

The S-matrix from (1) is standardized such that all of the incidents waves, a, are on one side of the equation and all of the reflections, b, are on the other. Thus, the S-matrix is always square such that the size of the S-matrix is always N×N for all multi-port networks.

The new T-matrix on the other hand is defined in such a way to facilitate the mathematics of cascading multiple ports so that entrance ports, m, are placed on the left side and exit ports, n, on the right. In many instances the number of entrance ports equals the number of exit ports (m=n), which results in a balanced square T-matrix of size N×N.

There are, however, certain applications where the number of entrance and exit ports are not equal (m≠n), resulting in an imbalance of symmetry and a non-square T-matrix of size M×N. As a consequence, the number of elements of a non-square T-matrix is always fewer than the numbers of elements of the S-matrix for the same port configuration. FIG. 1 shows this for a simplistic 3-port network where the T-matrix has eight elements and the corresponding S-matrix has nine.

Another subtle difference between the S- and T-matrices is that the S-matrix is only multiplied by the incident waves of both the entrance and exit ports, whereas the T-matrix is multiplied by both the incident and reflected waves of the exit ports only. This arises from the fact that the T-matrix is arranged with the intent of cascading multiple ports. The exact ordering of the incident and reflected waves, however, has not yet been standardized. For example, for a 4-port network the entrance ports could be ordered $b_1$, $a_1$, $b_2$, and $a_2$, shown in (7) or $b_1$, $b_2$, $a_1$, and $a_2$, similar to (6). For 2-port symmetry reasons the latter is a better choice. In an effort to utilize the 2-port symmetry, a new way is chosen to define the T-matrix:

$$\begin{bmatrix} b_1 \\ b_2 \\ \vdots \\ b_m \\ a_1 \\ a_2 \\ \vdots \\ a_m \end{bmatrix} = \begin{bmatrix} T_{11} & T_{12} & \ldots & T_{1N} \\ T_{21} & T_{22} & \ldots & T_{2N} \\ \vdots & \vdots & \ddots & \vdots \\ T_{M1} & T_{M2} & \ldots & T_{MN} \end{bmatrix} \cdot \begin{bmatrix} a_{(m+1)} \\ a_{(m+2)} \\ \vdots \\ a_{m+n} \\ b_{(m+1)} \\ b_{(m+2)} \\ \vdots \\ b_{m+n} \end{bmatrix} \quad (8)$$

where the size of the T-matrix is M×N such that M=2×m and N=2×n. Additionally, note that if the number of entrance and exit ports is equal to 1, then (8) reduces to the basic 2-port network of (4).

The practical reason why (8) was chosen as the generalized T-matrix form is most easily seen with balanced ports since they can be grouped so that they have a high degree of symmetry to the 2-port. This is accomplished by dividing a balanced network into quadrants where each quadrant consist of a sub-matrix. In the 2-port case the first ($T_{I,I}$), second ($T_{I,II}$), third ($T_{II,I}$), and fourth ($T_{II,II}$) quadrants are $T_{11}$, $T_{12}$, $T_{21}$ and $T_{22}$, respectively. FIG. 2 shows how to properly divide balanced 4- and 6-port networks into quadrants.

There are some important characteristics for higher order balanced ports that are based on the 2-port network. The first is that each quadrant forms square sub-matrices whose sizes are always $$\frac{N}{2} \times \frac{N}{2}.$$

This show that the smallest allowable quadrant size for balanced ports is the 2-port resulting in a sub-matrix with the size 1×1. Secondly, each quadrant sub-matrix has the same physical meaning as their corresponding 2-port equivalent. This means that the grouped quadrants of $T_{I,I}$ and $T_{II,II}$ are considered similar in function to $T_{11}$ and $T_{22}$.

Likewise, setting up the T-matrix according to (8) is advantageous for unbalanced ports because it provides a grouping symmetry to the 2-port. Therefore for unbalanced ports, the T- and S-matrices can be grouped into quadrants where each quadrant consists of a sub-matrix that is not necessarily square. This allows the quadrants $T_{I,I}$, $T_{I,II}$, $T_{II,I}$, and $T_{II,II}$ to be interpreted the same as their 2-port equivalents of $T_{11}$, $T_{12}$, $T_{21}$ and $T_{22}$, respectively. This symmetry becomes apparent when cascading unbalanced ports, in which the total forms a balanced port as illustrated in FIG. 3.

B. T-to-S Relations for Balanced Multi-Port Networks Using the Symmetry Extension Method:

For balanced ports there exists a direct relationship between the T- and S-matrices. Classically, this relationship is determined through simple linear algebra by simultaneously manipulating (1) and (8). In the most simple balanced port, the 2-port, the T-to-S relationship becomes:

$$\begin{bmatrix} S_{11} & S_{12} \\ S_{21} & S_{22} \end{bmatrix} = \begin{bmatrix} T_{12} \cdot T_{22}^{-1} & T_{11} - T_{12} \cdot T_{22}^{-1} \cdot T_{21} \\ T_{22}^{-1} & -T_{22}^{-1} \cdot T_{21} \end{bmatrix} \quad (9)$$

and $$\begin{bmatrix} T_{11} & T_{12} \\ T_{21} & T_{22} \end{bmatrix} = \begin{bmatrix} S_{12} - S_{11} \cdot S_{21}^{-1} \cdot S_{22} & S_{11} \cdot S_{21}^{-1} \\ -S_{21}^{-1} \cdot S_{22} & S_{21}^{-1} \end{bmatrix}. \quad (10)$$

The benefit of this classical method is that as long as the T- and S-matrices are properly defined it is possible to correctly derive the S-to-T relations for any sized balanced port. The drawback, however, is that this classical method becomes increasingly mathematically intensive with increasing ports to the point that it is not practical for networks with more than 4 ports.

Instead, a simpler method exists that uses the symmetry of the balanced 2-port where both the T- and the S-matrix are defined such that they can be divided into quadrants with the same grouping symmetry as the 2-port network. The significance of this grouping symmetry is that each quadrant sub-matrix has the same mathematical and physical meaning as their corresponding 2-port counterpart, thereby allowing the sub-matrices of larger balanced ports to replace the 2-port equivalents in (9) and (10). This substitution results in the fundamental 2-port equations or[11]:

$$\begin{bmatrix} [S_{I,I}] & [S_{I,II}] \\ [S_{II,I}] & [S_{II,II}] \end{bmatrix} = \begin{bmatrix} [T_{I,II}][T_{II,II}]^{-1} & [T_{I,I}] - [T_{I,II}][T_{II,II}]^{-1}[T_{II,I}] \\ [T_{II,II}]^{-1} & -[T_{II,II}]^{-1}[T_{II,I}] \end{bmatrix} \quad (11)$$

and $$\begin{bmatrix} [T_{I,I}] & [T_{I,II}] \\ [T_{II,I}] & [T_{II,II}] \end{bmatrix} = \begin{bmatrix} [S_{I,II}] - [S_{I,I}][S_{II,I}]^{-1}[S_{II,II}] & [S_{I,I}][S_{II,I}]^{-1} \\ -[S_{II,I}]^{-1}[S_{II,II}] & [S_{II,I}]^{-1} \end{bmatrix}. \quad (12)$$

The main benefit of the fundamental 2-port equations is that the mathematics become simple matrix operations rather than simultaneously solving multiple equations. This method provides an engineering implementable relationship between the S- and T-matrices for balanced large port networks.

C. T-to-S Relations for Unbalanced Multi-Port Networks Using the Symmetry Extension Method:

Since in unbalanced ports the number of entrance ports are different from the number of exit ports, the T-matrix becomes non-square and smaller in size than the corresponding S-matrix. This size difference causes a breakdown in symmetry that results in unbalanced ports always having more elements in the S-matrix than in T-matrix. However, despite this size imbalance, one of the main reasons that the new T-matrix is defined according to (8) is it preserves 2-port symmetry for both balanced and unbalanced port networks. The benefit with preserving this 2-port symmetry is that the sub-matrices of multi-port networks can replace their corresponding 2-port equivalents in (9) and (10).

In order to utilize the 2-port symmetry for unbalanced ports, both the T- and S-matrices must be divided into quadrants with sub-matrices. These quadrant sub-matrices are similar to balanced ports in that each sub-matrix has the same mathematical meaning as their corresponding 2-port equivalent. However, unlike balanced ports these sub-matrices are not necessarily square nor the same size. This is a concern because in order to apply 2-port symmetry and expand the fundamental 2-port equations for unbalanced ports, a suitable inverse of $S_{II,I}$ and $T_{II,II}$ must exist.

The T-matrix for unbalanced ports is always non-square with an even number of elements. Dividing the T-matrix is done by simply separating it into exact quadrants with the sub-matrices of size m×n, where m is the number of entrance ports and n the number of exit ports. This is illustrated for the simplistic 3-port network in FIG. 4 and FIG. 5.

The S-matrix on the other hand is divided more asymmetrically and varies depending on whether there are more entrance ports than exit ports. If the number of entrance ports exceeds the number of exit ports the sub-matrices are divided such that $S_{I,I}$ and $S_{II,II}$ are both square where $S_{I,I}$ is the largest in size and $S_{II,II}$ the smallest. This is shown clearly in FIG. 4 for a 3-port network. If the converse is true where the number of exit ports exceed the number of entrance ports, the sub-matrices are divided such that $S_{I,I}$ and $S_{II,II}$ are both square where $S_{II,II}$ is the largest in size and $S_{I,I}$ the smallest. FIG. 5 illustrates how to properly divide the S-matrix when the number of exit ports exceed the number of entrance ports for a 3-port network.

Once the S- and T-matrices are properly divided into quadrants and the corresponding sub-matrix 2-port equivalents are known, suitable inverses must be found for $S_{II,I}$ and $T_{II,II}$ in order to utilize the fundamental 2-port equations. Since $S_{II,I}$ and $T_{II,II}$ are always non-square matrices for unbalanced ports, regular matrix inverses do not exist. Instead, the most suitable inverses are found by computing the Moore-Penrose Pseudo-Inverse developed from the Singular-Value Decomposition (SVD) method which provides a computationally simpler and more accurate way to get the pseudo-inverse[12]. The fundamental 2-port equations for unbalanced ports become:

$$\begin{bmatrix} [S_{I,I}] & [S_{I,II}] \\ [S_{II,I}] & [S_{II,II}] \end{bmatrix} = \begin{bmatrix} [T_{I,II}][T_{II,II}]^{+} & [T_{I,I}] - [T_{I,II}][T_{II,II}]^{+}[T_{II,I}] \\ [T_{II,II}]^{+} & -[T_{II,II}]^{+}[T_{II,I}] \end{bmatrix} \quad (13)$$

and $$\begin{bmatrix} [T_{I,I}] & [T_{I,II}] \\ [T_{II,I}] & [T_{II,II}] \end{bmatrix} = \begin{bmatrix} [S_{I,II}] - [S_{I,I}][S_{II,I}]^{+}[S_{II,II}] & [S_{I,I}][S_{II,I}]^{+} \\ -[S_{II,I}]^{+}[S_{II,II}] & [S_{II,I}]^{+} \end{bmatrix}. \quad (14)$$

where $[S_{II,I}]^{+}$ represents the pseudo-inverse of $[S_{II,I}]$ and $[T_{II,II}]^{+}$ represents the pseudo-inverse of $[T_{II,II}]$.

One side effect of the asymmetry in size between the S- and T-matrix is that unbalanced ports lose the ability to accurately convert from the T-matrix to the S-matrix[13]. This phenomena is most easily seen in the 3-port network of FIG. 4 where interactions between port 1 and port 2 are not present in the T-matrix since these interactions do not "transfer" through the network. Thus, converting from the S-matrix to the T-matrix results in a loss of information which is evident with fewer elements in the T-matrix.

II. Simulation Results and Discussion

A. Cascading and De-Embedding Balanced Port Networks

Cascading networks refers to daisy-chaining the exit ports of one network to the entrance ports of another to form a more complex system. This is illustrated in FIG. 6 for a system of balanced 4-port networks, $T_A$, $T_{DUT}$, and $T_B$. The S-matrix may be used to cascade networks. However, since the mathematics does not allow the S-matrix for a straight forward de-embedding[1]. T-matrix is most suited for cascaded networks because the T-matrix is defined in such a way that cascading multi-port networks for both balanced and unbalanced ports becomes simple matrix multiplications. Therefore, the total T-matrix of FIG. 6 is equal to sequentially multiplying $T_A$, $T_{DUT}$, and $T_B$ or $$[T_{Total}]=[T_A][T_{DUT}][T_B] \quad (15).$$

Unfortunately the T-matrix cannot be measured directly, whereas the S-matrix can. However, by utilizing the fundamental 2-port equations and extending 2-port symmetry for multiple ports it is possible to convert from the S- or T-matrix of any balanced cascaded network. The methodology for solving for multi-port cascaded networks is: first use (12) to convert $S_A$, $S_{DUT}$, and $S_B$ to $T_A$, $T_{DUT}$, and $T_B$; secondly, find $T_{Total}$ by sequentially multiply $T_A$, $T_{DUT}$, and $T_B$ according to (15); lastly, use (11) to convert $T_{Total}$ to $S_{Total}$[2].

De-embedding refers to the ability of extracting the embedded $S_{DUT}$, for example, from the known networks of $S_A$, $S_B$, and $S_{Total}$. Thus, using the same methodology by mathematically rearranging and solving the cascaded T-matrices system (15) becomes[2,3]:

$$[T_{DUT}]=[T_A]^{-1}[T_{total}][T_B]^{-1} \quad (16).$$

Figure 8:
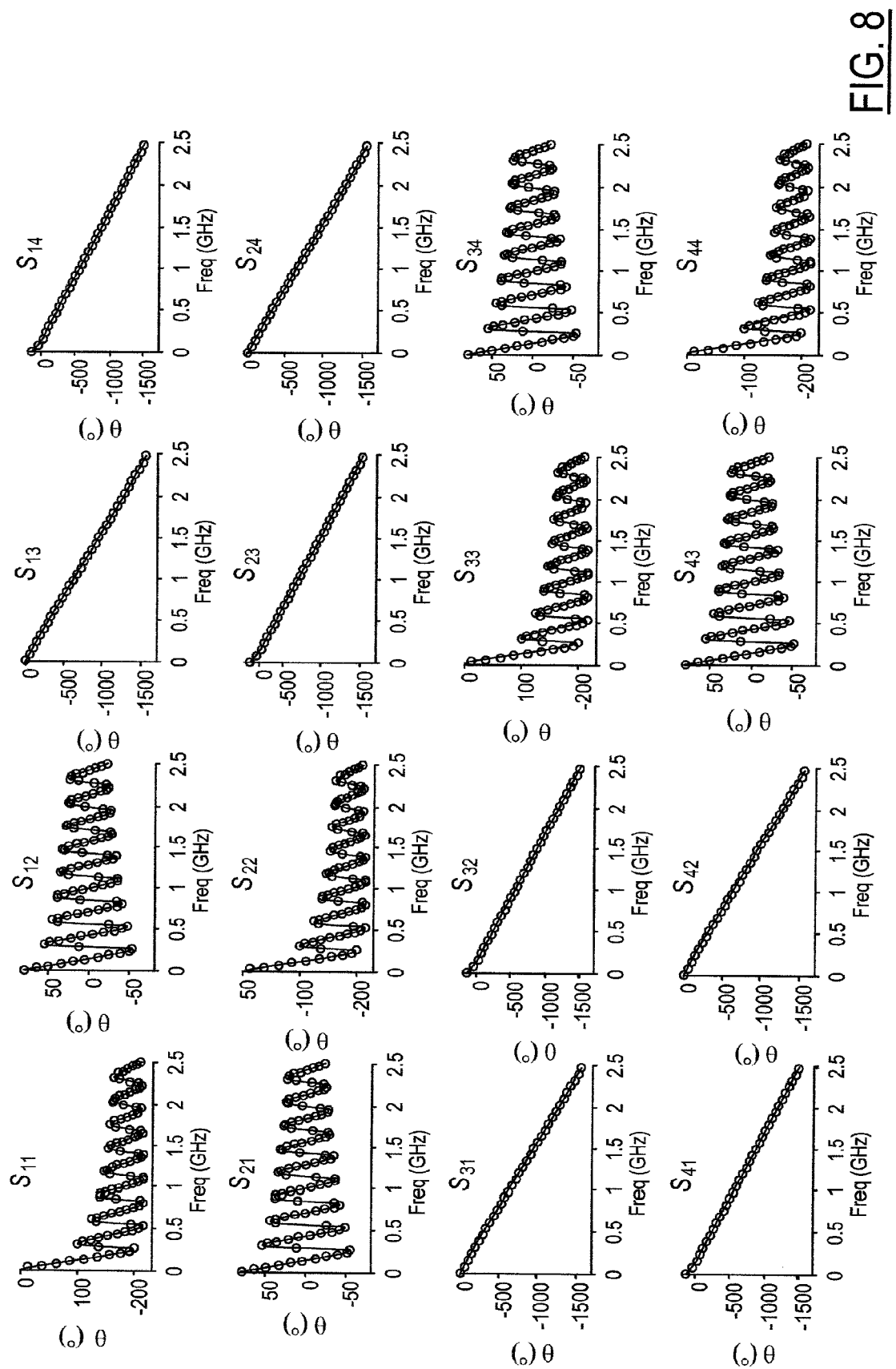
FIG. 8 illustrates unwrapped phase values for each S-parameter where the lines represent original $S_{DUT}$ values and the circles are the de-embedded $S_{DUT}$ values, the Figure is limited to 2.5 GHz for illustration purposes and embodiments of the invention are not limited in frequency.

Provided a suitable inverse exists for $T_A$ and $T_B$, $T_{DUT}$ and $S_{DUT}$ can be easily determined through (16) for any balanced port network. This is shown in an example for a 4-port balanced de-embedded DUT in FIG. 7 and FIG. 8 where the lines represent original values and the circles are the de-embedded values utilizing (12), (11) and (16).

B. Cascading and De-Embedding Unbalanced Port Networks

Similar to balanced ports, some unbalanced ports can also be cascaded and de-embedded. However, the loss of symmetry in unbalanced ports causes two distinct differences. The first is that the certain interactions in the S-matrix do not transfer into the T-matrix. Thus, converting from the S- to the T-matrix results in a loss of information as is evident from the fact that the S-matrix is always larger than the T-matrix for unbalanced ports. Since the T-matrix definition is the same for both balanced and unbalanced ports, it is possible to cascade both balanced and unbalanced networks so that $T_{Total}$ and $T_{DUT}$ form balanced ports as seen in both FIG. 9 and FIG. 10. Because unbalanced ports lose information when converting from the S- to T-matrix, it is crucial that $T_{Total}$ is a balanced port for cascaded networks or $T_{DUT}$ is a balanced port for de-embedded networks. Otherwise, $T_{Total}$ or $T_{DUT}$ generate inaccurate elements when converted back to their corresponding S-matrix[13].

The second difference is specific to de-embedding in that the pseudo-inverse of unbalanced cascaded multi-port networks exists only for either a left-inverse, $(T_A)^L$, or a right-inverse $(T_B)^R$. Thus, for unbalanced ports, (16) is rewritten as:

$$[T_{DUT}]=[T_A]^L[T_{total}][T_B]^R \quad (17)$$

This means that unlike balanced ports only certain unbalanced cascaded multi-port networks can be de-embedded because the pseudo-inverse may exist as a right-inverse and not a left-inverse or vice-versa. Furthermore, it is the unbalance of entrance and exit ports that determine which inverse exists. Specifically, if the number of entrance ports are greater than the number of exit ports, the pseudo-inverse is a left-inverse, $(T_A)^L$. If the number of exit ports are greater than the number of entrance ports, the pseudo-inverse is a right-inverse, $(T_B)^R$. FIG. 10 shows a cascaded network where de-embedding $T_{DUT}$ is possible since $T_A$ requires the left-inverse and $T_B$ requires the right-inverse. Conversely, de-embedding the network in FIG. 9 is not possible because the left-inverse of $T_B$ and the right-inverse of $T_A$ do not exist.

Figure 11:
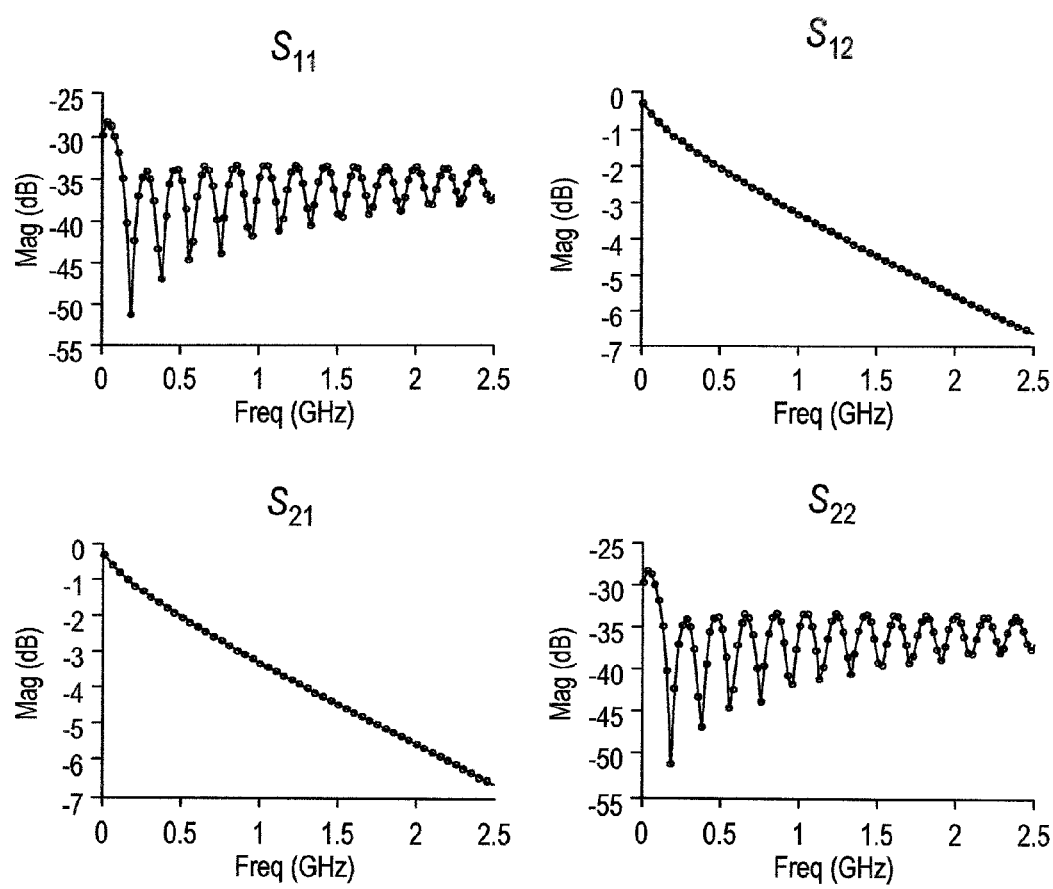
FIG. 11 illustrates magnitude values for each S-parameter where the lines represent original $S_{DUT}$ values and the circles are the de-embedded $S_{DUT}$ values, the Figure is limited to 2.5 GHz for illustration purposes and embodiments of the invention are not limited in frequency.
Figure 12:
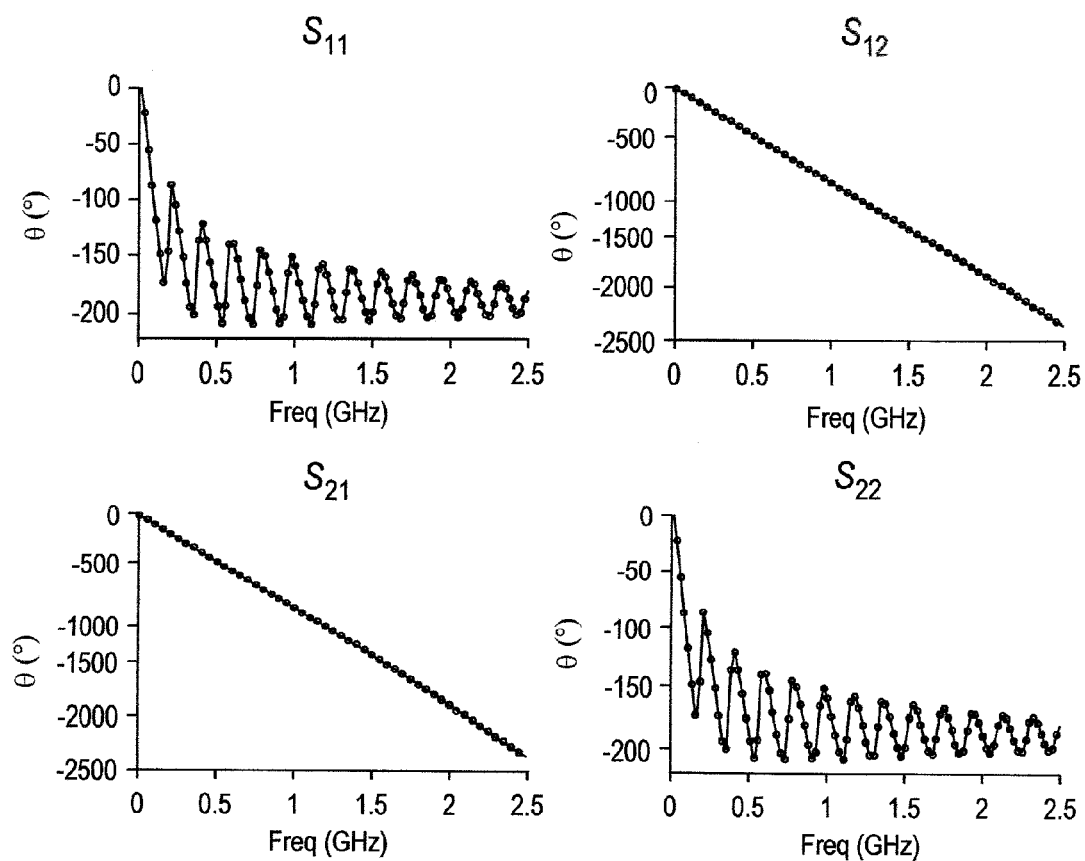
FIG. 12 illustrates unwrapped phase values for each S-parameter where the lines represent original $S_{DUT}$ values and the circles are the de-embedded $S_{DUT}$ values, the Figure is limited to 2.5 GHz for illustration purposes and embodiments of the invention are not limited in frequency.

FIG. 11 and FIG. 12 show the de-embedded DUT from the setup in FIG. 10. The lines represent the original values and the circles are the de-embedded values utilizing (14), (13), and (17).

Further, it is possible to group networks together to form equivalent networks. For example, when de-embedding a system of 5 multiport networks where the first and fifth each is a balanced 4-port, the second and fourth each is a 3-port (unbalanced), and the third is a 2-port (DUT), it is possible to group the first and second into one group that is a 3-port equivalent ($T_A$), and the fourth and the fifth into another 3-port equivalent ($T_B$), with the embedded network ($T_{DUT}$) in the middle. This effectively makes a group of 3 multiport networks similar to FIG. 10 but with 5 multiport networks. Similarly, this could be extended to 7, 9, etc. multiport networks.

III. Conclusion

The proposed standardized T-matrix definition provides a novel approach for converting between S-parameters and T-parameters for multi-port networks based on the well understood and mathematically simple 2-port relations. Similarly, by properly defining the sub-matrices for multi-port networks the fundamental 2-port equations can be expanded for both balanced and unbalanced ports to provide an engineering implementable relationship between the S- and T-parameters for multi-port networks. This method allows a practical means to cascade and de-embed such networks through simple matrix algebra provided that a suitable inverse exists.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A method for making measurements using a vector network analyzer, and for multi-port S-parameter and T-parameter conversion, the method comprising:

defining an S-matrix according to:

$$\begin{bmatrix} b_1 \\ b_2 \\ \vdots \\ b_N \end{bmatrix} = \begin{bmatrix} S_{11} & S_{12} & \cdots & S_{1N} \\ S_{21} & S_{22} & \cdots & S_{2N} \\ \vdots & \vdots & \ddots & \vdots \\ S_{N1} & S_{N2} & \cdots & S_{NN} \end{bmatrix} \cdot \begin{bmatrix} a_1 \\ a_2 \\ \vdots \\ a_N \end{bmatrix} = [S] \cdot \begin{bmatrix} a_1 \\ a_2 \\ \vdots \\ a_N \end{bmatrix}$$

wherein the size of the S-matrix is N×N such that N is the number of ports for a network being analyzed;

defining quadrants for the S-matrix by dividing the S-matrix into quadrants wherein each quadrant is a sub-matrix, and such that the divided S-matrix provides a grouping symmetry to a 2-port network;

defining a T-matrix according to:

$$\begin{bmatrix} b_1 \\ b_2 \\ \vdots \\ b_m \\ a_1 \\ a_2 \\ \vdots \\ a_m \end{bmatrix} = \begin{bmatrix} T_{11} & T_{12} & \ldots & T_{1N} \\ T_{21} & T_{22} & \ldots & T_{2N} \\ \vdots & \vdots & \ddots & \vdots \\ T_{M1} & T_{M2} & \ldots & T_{MN} \end{bmatrix} \cdot \begin{bmatrix} a_{(m+1)} \\ a_{(m+2)} \\ \vdots \\ a_{m+n} \\ b_{(m+1)} \\ b_{(m+2)} \\ \vdots \\ b_{m+n} \end{bmatrix}$$

wherein the size of the T-matrix is M×N such that M=2×m and N=2×n where m is the number of entrance ports and n is the number of exit ports for the network being analyzed;

defining quadrants for the T-matrix by dividing the T-matrix into quadrants wherein each quadrant is a sub-matrix, and such that the divided T-matrix provides the same grouping symmetry to the 2-port network to provide a defined relationship between the S- and T-matrices; and making measurements pertaining to a plurality of networks, and manipulating the measurements in accordance with the defined relationship between the S- and T-matrices to result in other measurements pertaining to the plurality of networks.

2. The method of claim 1 further comprising:
cascading a first network having an S-matrix $S_A$, a second network having an S-matrix $S_{DUT}$, and a third network having an S-matrix $S_B$, wherein cascading comprises:
converting the S-matrix $S_A$ to a corresponding T-matrix $T_A$ in accordance with the defined relationship;
converting the S-matrix $S_{DUT}$ to a corresponding T-matrix $T_{DUT}$ in accordance with the defined relationship;
converting the S-matrix $S_B$ to a corresponding T-matrix $T_B$ in accordance with the defined relationship;
sequentially multiplying matrices $T_A$, $T_{DUT}$, and $T_B$ to produce T-matrix $T_{Total}$; and
converting the T-matrix $T_{Total}$ to a corresponding S-matrix $S_{Total}$ in accordance with the defined relationship.

3. The method of claim 2 wherein the T-matrix $T_{Total}$ represents a balanced network, and wherein the first network and the third network are balanced networks.

4. The method of claim 2 wherein the T-matrix $T_{Total}$ represents a balanced network, and wherein the first network and the third network are unbalanced networks.

5. The method of claim 1 further comprising:
cascading a plurality of networks, each network having an S-matrix;
for each S-matrix, converting the S-matrix to a corresponding T-matrix in accordance with the defined relationship;
sequentially multiplying the T-matrices of the cascaded networks to produce T-matrix $T_{Total}$; and
converting the T-matrix $T_{Total}$ to a corresponding S-matrix $S_{Total}$ in accordance with the defined relationship.

6. The method of claim 5 wherein the T-matrix $T_{Total}$ represents a balanced network, and wherein each network of the plurality of networks is a balanced network.

7. The method of claim 5 wherein the T-matrix $T_{Total}$ represents a balanced network, wherein the plurality of networks is composed of a first group of networks, an embedded network, and a third group of networks, and wherein the first group of networks and the third group of networks each form an unbalanced network.

8. The method of claim 1 further comprising:
de-embedding an embedded network from a sequence of cascaded networks having an S-matrix $S_{Total}$, the sequence of cascaded networks including a first network having an S-matrix $S_A$, the embedded network, and a third network having an S-matrix $S_B$, wherein de-embedding comprises:
converting the S-matrix $S_A$ to a corresponding T-matrix $T_A$ in accordance with the defined relationship;
converting the S-matrix $S_B$ to a corresponding T-matrix $T_B$ in accordance with the defined relationship;
converting the S-matrix $S_{Total}$ to a corresponding T-matrix $T_{Total}$ in accordance with the defined relationship;
inverting the T-matrices $T_A$ and $T_B$ to produce respective inverted T-matrices $[T_A]^{-1}$ and $[T_B]^{-1}$;
sequentially multiplying matrices $[T_A]^{-1}$, $T_{Total}$, and $[T_B]^{-1}$ to produce T-matrix $T_{DUT}$; and
converting the T-matrix $T_{DUT}$ to a corresponding S-matrix $S_{DUT}$ in accordance with the defined relationship.

9. The method of claim 8 wherein the T-matrix $T_{DUT}$ represents a balanced network, and wherein the first network and the third network are balanced networks.

10. The method of claim 8 wherein the T-matrix $T_{DUT}$ represents a balanced network, and wherein the first network and the third network are unbalanced networks.

11. The method of claim 10 wherein inverting the T-matrices $T_A$ and $T_B$ comprises determining suitable respective pseudo-inverses.

12. The method of claim 1 further comprising:
de-embedding an embedded network from a sequence of cascaded networks where the cascaded system has an S-matrix $S_{Total}$, each network in the cascaded system having an S-matrix;
for the S-matrix for each additional network, converting the S-matrix to a corresponding T-matrix in accordance with the defined relationship;
converting the S-matrix $S_{Total}$ to a corresponding T-matrix $T_{Total}$ in accordance with the defined relationship;
for the T-matrix for each additional network, inverting the T-matrix to produce a corresponding inverted T-matrix;
sequentially multiplying the inverted T-matrices of the networks and the T-matrix $T_{Total}$ to produce T-matrix $T_{DUT}$; and
converting the T-matrix $T_{DUT}$ to a corresponding S-matrix $S_{DUT}$ in accordance with the defined relationship.

13. The method of claim 12 wherein the T-matrix $T_{DUT}$ represents a balanced network, and wherein each network of the plurality of networks is a balanced network.

14. The method of claim 12 wherein the T-matrix $T_{DUT}$ represents a balanced network, wherein the sequence of cascaded networks is composed of a first group of networks, the embedded network, and a third group of networks, and wherein the first group of networks and the third group of networks each form an unbalanced network.

15. The method of claim 14 wherein inverting the T-matrix for an unbalanced network comprises determining a suitable pseudo-inverse.

16. A system for making measurements using a vector network analyzer, and for multi-port S-parameter and T-parameter conversion, the system comprising a computer-readable storage medium having instructions stored thereon that are executable by a computer to perform a method comprising:

defining an S-matrix according to:

$$\begin{bmatrix} b_1 \\ b_2 \\ \vdots \\ b_N \end{bmatrix} = \begin{bmatrix} S_{11} & S_{12} & \ldots & S_{1N} \\ S_{21} & S_{22} & \ldots & S_{2N} \\ \vdots & \vdots & \ddots & \vdots \\ S_{N1} & S_{N2} & \ldots & S_{NN} \end{bmatrix} \cdot \begin{bmatrix} a_1 \\ a_2 \\ \vdots \\ a_N \end{bmatrix} = [S] \cdot \begin{bmatrix} a_1 \\ a_2 \\ \vdots \\ a_N \end{bmatrix}$$

wherein the size of the S-matrix is N×N such that N is the number of ports for a network being analyzed;
  defining quadrants for the S-matrix by dividing the S-matrix into quadrants wherein each quadrant is a sub-matrix, and such that the divided S-matrix provides a grouping symmetry to a 2-port network;
  defining a T-matrix according to:

$$\begin{bmatrix} b_1 \\ b_2 \\ \vdots \\ b_m \\ a_1 \\ a_2 \\ \vdots \\ a_m \end{bmatrix} = \begin{bmatrix} T_{11} & T_{12} & \ldots & T_{1N} \\ T_{21} & T_{22} & \ldots & T_{2N} \\ \vdots & \vdots & \ddots & \vdots \\ T_{M1} & T_{M2} & \ldots & T_{MN} \end{bmatrix} \cdot \begin{bmatrix} a_{(m+1)} \\ a_{(m+2)} \\ \vdots \\ a_{m+n} \\ b_{(m+1)} \\ b_{(m+2)} \\ \vdots \\ b_{m+n} \end{bmatrix}$$

wherein the size of the T-matrix is M×N such that M=2×m and N=2×n where m is the number of entrance ports and n is the number of exit ports for the network being analyzed;
  defining quadrants for the T-matrix by dividing the T-matrix into quadrants wherein each quadrant is a sub-matrix, and such that the divided T-matrix provides the same grouping symmetry to the 2-port network to provide a defined relationship between the S- and T-matrices; and
  making measurements pertaining to a plurality of networks, and manipulating the measurements in accordance with the defined relationship between the S- and T-matrices to result in other measurements pertaining to the plurality of networks.

17. The system of claim 16 wherein the method further comprises:
  cascading a first network having an S-matrix $S_A$, a second network having an S-matrix $S_{DUT}$, and a third network having an S-matrix $S_B$, wherein cascading comprises:
  converting the S-matrix $S_A$ to a corresponding T-matrix $T_A$ in accordance with the defined relationship;
  converting the S-matrix $S_{DUT}$ to a corresponding T-matrix $T_{DUT}$ in accordance with the defined relationship;
  converting the S-matrix $S_B$ to a corresponding T-matrix $T_B$ in accordance with the defined relationship;
  sequentially multiplying matrices $T_A$, $T_{DUT}$, and $T_B$ to produce T-matrix $T_{total}$; and
  converting the T-matrix $T_{Total}$ to a corresponding S-matrix $S_{Total}$ in accordance with the defined relationship.

18. The system of claim 16 wherein the method further comprises:
  de-embedding an embedded network from a sequence of cascaded networks having an S-matrix $S_{Total}$, the sequence of cascaded networks including a first network having an S-matrix $S_A$, the embedded network, and a third network having an S-matrix $S_B$, wherein de-embedding comprises:
  converting the S-matrix $S_A$ to a corresponding T-matrix $T_A$ in accordance with the defined relationship;
  converting the S-matrix $S_B$ to a corresponding T-matrix $T_B$ in accordance with the defined relationship;
  converting the S-matrix $S_{Total}$ to a corresponding T-matrix $T_{Total}$ in accordance with the defined relationship;
  inverting the T-matrices $T_A$ and $T_B$ to produce respective inverted T-matrices $[T_A]^{-1}$ and $[T_B]^{-1}$;
  sequentially multiplying matrices $[T_A]^{-1}$, $T_{Total}$, and $[T_B]^{-1}$ to produce T-matrix $T_{DUT}$; and
  converting the T-matrix $T_{DUT}$ to a corresponding S-matrix $S_{DUT}$ in accordance with the defined relationship.

19. An apparatus for making measurements, and for multi-port S-parameter and T-parameter conversion, the apparatus comprising a programmed device that performs a method comprising:
  defining an S-matrix according to:

$$\begin{bmatrix} b_1 \\ b_2 \\ \vdots \\ b_N \end{bmatrix} = \begin{bmatrix} S_{11} & S_{12} & \ldots & S_{1N} \\ S_{21} & S_{22} & \ldots & S_{2N} \\ \vdots & \vdots & \ddots & \vdots \\ S_{N1} & S_{N2} & \ldots & S_{NN} \end{bmatrix} \cdot \begin{bmatrix} a_1 \\ a_2 \\ \vdots \\ a_N \end{bmatrix} = [S] \cdot \begin{bmatrix} a_1 \\ a_2 \\ \vdots \\ a_N \end{bmatrix}$$

wherein the size of the S-matrix is N×N such that N is the number of ports for a network being analyzed;
  defining quadrants for the S-matrix by dividing the S-matrix into quadrants wherein each quadrant is a sub-matrix, and such that the divided S-matrix provides a grouping symmetry to a 2-port network;
  defining a T-matrix according to:

$$\begin{bmatrix} b_1 \\ b_2 \\ \vdots \\ b_m \\ a_1 \\ a_2 \\ \vdots \\ a_m \end{bmatrix} = \begin{bmatrix} T_{11} & T_{12} & \ldots & T_{1N} \\ T_{21} & T_{22} & \ldots & T_{2N} \\ \vdots & \vdots & \ddots & \vdots \\ T_{M1} & T_{M2} & \ldots & T_{MN} \end{bmatrix} \cdot \begin{bmatrix} a_{(m+1)} \\ a_{(m+2)} \\ \vdots \\ a_{m+n} \\ b_{(m+1)} \\ b_{(m+2)} \\ \vdots \\ b_{m+n} \end{bmatrix}$$

wherein the size of the T-matrix is M×N such that M=2×m and N=2×n where m is the number of entrance ports and n is the number of exit ports for the network being analyzed;
  defining quadrants for the T-matrix by dividing the T-matrix into quadrants wherein each quadrant is a sub-matrix, and such that the divided T-matrix provides the same grouping symmetry to the 2-port network to provide a defined relationship between the S- and T-matrices; and
  making measurements pertaining to a plurality of networks, and manipulating the measurements in accordance with the defined relationship between the S- and T-matrices to result in other measurements pertaining to the plurality of networks.

20. The apparatus of claim 19 wherein the apparatus comprises a vector network analyzer.

* * * * *